(12) United States Patent
D'Arrigo et al.

(10) Patent No.: US 8,890,103 B2
(45) Date of Patent: Nov. 18, 2014

(54) SEMICONDUCTOR SUBSTRATE SUITABLE FOR THE REALISATION OF ELECTRONIC AND/OR OPTOELECTRONIC DEVICES AND RELATIVE MANUFACTURING PROCESS

(75) Inventors: Giuseppe Alessio Maria D'Arrigo, Catania (IT); Francesco La Via, Catania (IT)

(73) Assignee: Consiglio Nazionale Delle Ricerche (IT)

( * ) Notice: Subject to any disclaimer, the term of this patent is extended or adjusted under 35 U.S.C. 154(b) by 0 days.

(21) Appl. No.: 13/299,935

(22) Filed: Nov. 18, 2011

(65) Prior Publication Data
US 2012/0133027 A1    May 31, 2012

Related U.S. Application Data

(63) Continuation-in-part of application No. 12/504,167, filed on Jul. 16, 2009, now abandoned, which is a continuation-in-part of application No. PCT/IT2008/000025, filed on Jan. 17, 2008.

(30) Foreign Application Priority Data

Jan. 17, 2007 (IT) .............................. MI2007A0056

(51) Int. Cl.
*H01L 29/00* (2006.01)
*H01L 21/02* (2006.01)

(52) U.S. Cl.
CPC .... *H01L 21/02532* (2013.01); *H01L 21/02521* (2013.01); *H01L 21/02439* (2013.01); *H01L 21/0245* (2013.01); *H01L 21/02502* (2013.01); *H01L 21/02513* (2013.01); *H01L 21/02381* (2013.01)
USPC ........................ 257/1; 257/E29.002; 257/629

(58) Field of Classification Search
USPC ............................... 257/629, 633, 1, E29.002
See application file for complete search history.

(56) References Cited

U.S. PATENT DOCUMENTS

| 7,101,774 | B2 | 9/2006 | Nagasawa et al. |
|---|---|---|---|
| 2001/0031514 | A1 | 10/2001 | Smith |
| 2003/0017712 | A1 | 1/2003 | Brendel |
| 2004/0232440 | A1 | 11/2004 | Ohtsuka et al. |
| 2005/0121693 | A1 | 6/2005 | Udagawa et al. |
| 2005/0161702 | A1 | 7/2005 | Linthicum et al. |
| 2005/0211988 | A1 | 9/2005 | Leycuras |
| 2005/0287770 | A1 | 12/2005 | Hasan |
| 2007/0171529 | A1* | 7/2007 | Chuang .................... 359/530 |

* cited by examiner

*Primary Examiner* — Matthew Reames
(74) *Attorney, Agent, or Firm* — Akerman LLP

(57) ABSTRACT

A semiconductive substrate that is suitable for realising electronic and/or optoelectronic devices that include at least one substrate, in particular of single crystal silicon, and an overlying layer of single crystal silicon. Advantageously, the semiconductive substrate comprises at least one functional coupling layer suitable for reducing the defects linked to the differences in the materials used. The functional coupling layer can comprise a corrugated portion made in the layer of single crystal silicon and suitable for reducing the defects linked to the differences in lattice constant of such materials used. Alternatively, the functional coupling layer can comprise a porous layer arranged between the substrate of single crystal silicon and the layer of single crystal silicon, and suitable for reducing the stress caused by the differences between the thermal expansion coefficients of the materials used. A manufacturing process of such a semiconductive substrate is also described.

14 Claims, 7 Drawing Sheets

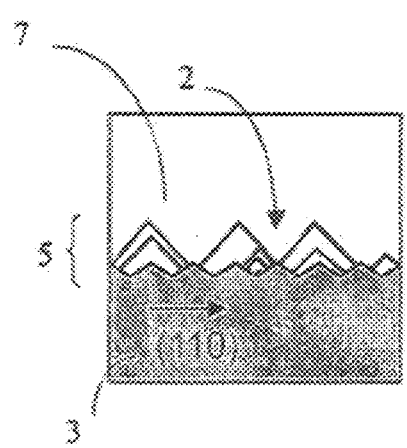
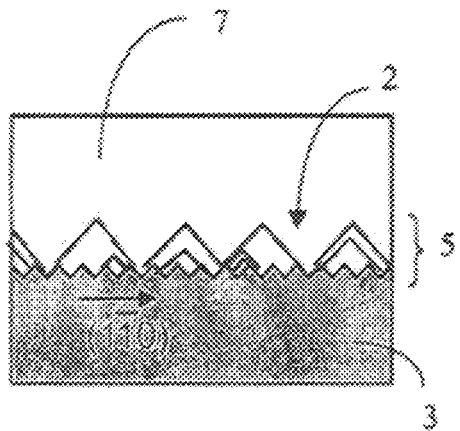
FIG. 4A          FIG. 4B
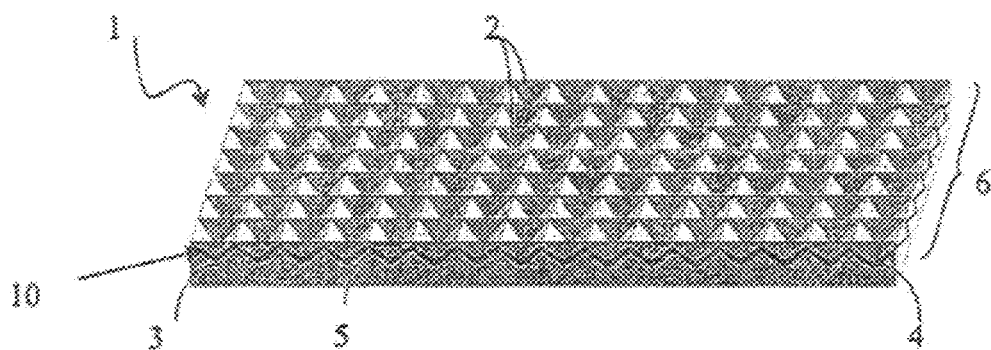
FIG. 5

SEMICONDUCTOR SUBSTRATE SUITABLE FOR THE REALISATION OF ELECTRONIC AND/OR OPTOELECTRONIC DEVICES AND RELATIVE MANUFACTURING PROCESS

CROSS-REFERENCE TO RELATED APPLICATIONS

This application is a continuation-in-part U.S. patent application Ser. No. 12/504,167, filed Jul. 16, 2009, which is a continuation-in-part of International Application No. PCT/IT2008/000025, filed Jan. 17, 2008, which claims the benefit of Italian Patent Application No. MI2007A 000056, filed Jan. 17, 2007.

DESCRIPTION

1. Field of Application

The present invention refers to a semiconductive substrate suitable for realising electronic and/or optoelectronic devices.

More specifically, the invention refers to a semiconductive substrate of the type comprising at least one silicon substrate and an overlying layer of single crystal silicon.

The invention also refers to a manufacturing process of such a semiconductive substrate.

2. Prior Art

In integration technologies on silicon, different methods are known for realising silicon blocks or ingots of large size (up to 300 mm in diameter).

Amongst the most well known methods there are, for example, the Czochralski process and the so-called Floating Zone technique through which it is possible to obtain extremely pure silicon blocks, in the form of cylindrical ingots, the basic material for realising so-called wafers for the integration of semiconductor devices.

The aforementioned techniques cannot, however, be used in the case of semiconductive materials alternative to silicon, such as silicon carbide (SiC), gallium nitride (GaN) or aluminium nitride for which there is no liquid phase.

In the past, other different techniques have thus been used to carry out the growth of these semiconductor materials alternative to silicon, nevertheless encountering numerous technological difficulties in the growth of large sized crystals at the same time as a high growth rate and a low presence of defects.

Due to such technological difficulties, semiconductor materials alternative to silicon can currently be grown into smaller sized crystals (from 75 to 100 mm in diameter) and at really high costs (for example, a 76 mm wafer of silicon carbide (SiC) has a production cost of 500-700$ compared to a production cost of 20$ for the wafer of silicon).

Therefore, there is a great need to define a new technique capable of realising blocks, in particular wafers, of a semiconductive material alternative to silicon. Such blocks must be of a suitable size for the integration of electronic semiconductor devices, in particular larger than the size of the blocks that can currently be made, as well as having lower production costs, so as to be able to be a valid alternative to silicon wafers. A possible solutions consists of using silicon as nucleus for the growth of single crystal blocks or ingots in one of the semiconductor materials alternative to silicon. This method goes by the name heteroepitaxy.

The main problem with such heteroepitaxial growth is the great mismatch between lattices of the crystalline structure of the silicon and of layers made from one of such semiconductor materials alternative to silicon. For example, it is equal to about 25% in the case of silicon carbide (SiC) and to about 20% in the case of gallium nitride (GaN). Such a mismatch has the consequence of the formation of crystallographic defects like the dislocations that allow the relaxation of a film grown by heteroepitaxy. The high densities of such dislocations cause the reduction in breakdown voltage and an increase in leakage current of the semiconductor devices.

The only possibility for obtaining semiconductor devices with good characteristics thus consists of eliminating or at least reducing as much as possible such defects and different methods have been proposed to do so.

A first known method consists of using a buffer layer having a lattice constant that is variable with continuity or a plurality of lattice constants with different values scaled with continuity, starting from a value equal to the lattice constant of silicon up to a value equal to the lattice constant of the used semiconductive material alternative to silicon.

Such a method is described for example in the US patent application No. US 2005/0211988 that describes the use of a substrate of silicon-germanium (SiGe) alloy to "match" the lattice constants involved. Indeed, it has been observed that by using a concentration of germanium close to 7%, the equivalency of five lattice constants of silicon carbide (SiC) is obtained with four lattice constants of silicon-germanium (SiGe) alloy.

However, in this case there is a great difference in the expansion coefficient of the materials used and, consequently, a substantial bow value of the wafer thus obtained, which constitutes a serious problem in using such materials within an integration process of semiconductor devices.

It is thus necessary to increase the germanium percentage used up to 16%, which does, however, introduce a great lattice mismatch between the silicon-germanium (SiGe) alloy and the silicon carbide (SiC).

Similar behaviour is equally described in the patent application indicated above in the case of another semiconductive material alternative to silicon, in other words in the case of gallium nitride (GaN), where to compensate for the difference in the expansion coefficient it is sufficient to use a germanium percentage of 13%, whereas the differences in lattice constant take such a percentage up to 86%.

From U.S. patent application No. U.S. 2005/0287770 a method is also known for directly growing a composite semiconductor (silicon carbide (SiC), gallium arsenide (GaN) or silicide) on a substrate of porous silicon. The use of such a substrate shows a good relaxation of the stress due to the differences between the heat expansion coefficients, leaving the problem of the defects linked to the mismatch of the different crystalline lattices.

Furthermore, the U.S. Pat. No. 7,101,774 describes an interesting approach aimed at reducing the problems linked to the mismatch of different crystalline lattices.

According to such a patent, a scratched substrate is used to produce a reduction in the planar defects perpendicular to the scratch direction on the surface of the silicon substrate. Such a provision is not however able to reduce other defects, for example the planar defects parallel to the scratch direction defined above.

Moreover, the great difference existing between the heat expansion coefficients of the materials used, in other words— as described in such a patent—silicon and silicon carbide (SiC), leads to a substrate being obtained that is highly stressed and with a high bow value of the wafer, which introduces serious problems, in particular for the photolithographic processes commonly used for the integration of the semiconductor devices.

The technical problem forming the basis of the present invention is to devise a manufacturing process of a semiconductive substrate suitable for the integration of a semiconductor device, having structural and functional characteristics such as to allow to overcome the limitations and drawbacks that the substrates made according to the prior art still suffer from, in particular such as to allow semiconductor materials alternative to silicon to be used.

SUMMARY OF THE INVENTION

The idea of solution on the basis of the present invention is to realise a semiconductive substrate comprising a porous layer in combination with a particular surface structure of the substrate itself, capable of completely eliminating the planar defects linked to the mismatch of the crystalline lattices of the materials used, in particular semiconductor materials alternative to silicon, at the same time reducing the stress induced on an epitaxial layer made above such a substrate and the bow value of the semiconductive wafer obtained from such a substrate.

Based upon such an idea of solution, the technical problem is solved by a semiconductive substrate suitable for realising electronic and/or optoelectronic devices comprising said semiconductive substrate, said semiconductive substrate in turn comprising a single crystal silicon substrate, an overlying layer of single crystal silicon, and at least one functional coupling layer suitable for reducing the defects linked to the differences in the materials used, said at least one functional coupling layer comprising a plurality of microstructures shaped like inverse pyramids having a tip.

The functional coupling layer can comprise a corrugated portion made in the layer of single crystal silicon and suitable for reducing the defects linked to the differences in lattice constant of such materials used. Alternatively, the functional coupling layer comprises a porous layer arranged between the silicon substrate and the layer of single crystal silicon and suitable for reducing the stress caused by the differences between the thermal expansion coefficients of the materials used.

In a preferred embodiment, the functional coupling layer comprises a corrugated portion made in the layer of single crystal silicon and suitable for reducing the defects linked to the differences in lattice constant of such materials used and a porous layer arranged between the silicon substrate and the layer of single crystal silicon and suitable for reducing the stress caused by the differences between the thermal expansion coefficients of the materials used.

According to an aspect of the invention, said corrugated portion comprises a plurality of microstructures made in said layer of single crystal silicon.

In particular, according to this aspect of the invention, said microstructures are equidistant according to at least one direction between a first and a second direction of extension of said semiconductive substrate.

In particular, said microstructures are equidistant according to said first and second direction of extension of said semiconductive substrate.

Moreover, according to this aspect of the invention, said microstructures are shaped like an inverse pyramid.

Namely, said microstructures are shaped like a rectilinear pyramid with a square base formed by the planes of the family 111 arranged symmetrically around a central axis having its centre coinciding with a centre of symmetry of a base of said rectilinear pyramid.

According to another aspect of the invention, said microstructures are of the type projecting from a plane of said substrate of single crystal silicon.

In particular, according to this aspect of the invention, said microstructures of the projecting type are diamond shaped.

Namely, said microstructures of the projecting type are symmetrical diamond shaped, formed by the planes of the family 111 and of the family 211 arranged around a central axis having its centre coinciding with a centre of symmetry of a base of said diamond.

According to yet another aspect of the invention, said functional coupling layer comprises a porous layer arranged between said substrate of single crystal silicon and said layer of single crystal silicon and suitable for reducing the stress caused by the differences between the thermal expansion coefficients of the materials used.

According to this aspect of the invention, said porous layer comprises a layer of porous silicon.

Namely, said porous layer consists of a layer with bubbles.

According to another aspect of the invention, said porous layer has a different porosity between a surface area thereof, positioned at said layer of single crystal silicon and a bottom area thereof, positioned in a position opposite said layer of single crystal silicon.

In particular, according to this aspect of the invention, said surface area of said porous layer has a porosity equal to 40%-45% and a thickness of the order of a few nanometers and in that said bottom area of said porous layer has greater porosity and thickness than said surface area.

Namely, said bottom area has a porosity equal to 60% and a thickness equal to 10 micron.

According to yet another aspect of the invention, said functional coupling layer further comprises a porous layer as previously defined.

Moreover, according to a further aspect of the invention, the semiconductive substrate also comprises a surface layer made above said porous layer.

According to this aspect of the invention, said surface layer is made from a semiconductive material alternative to silicon.

In particular, said surface layer is made from a material chosen from silicon carbide, gallium nitride, gallium arsenide, selenium-zinc and silicon-germanium.

Furthermore, according to yet another aspect of the invention, the semiconductive substrate further comprises a silicon buffer layer made between said functional coupling layer and said surface layer.

The problem is also solved by a manufacturing process of A manufacturing process of a semiconductive substrate suitable for realising electronic and/or optoelectronic devices which comprise said semiconductive substrate, the method comprising the steps of:
  forming a single crystal silicon substrate;
  epitaxially growing a layer of single crystal silicon above said single crystal silicon substrate; and
  realising a functional coupling layer above said single crystal silicon substrate, wherein said step of realising a functional coupling layer comprises a step of defining a plurality of microstructures shaped like inverse pyramids having a tip in said layer of single crystal silicon.

In another aspect of the invention, said step of realising a corrugated portion of said semiconductive substrate, said corrugated portion having the function of a functional coupling layer.

In particular, according to this aspect of the invention, said step of realising said corrugated portion comprises a step of defining a plurality of microstructures in said layer of single crystal silicon.

According to another aspect of the invention, said step of epitaxial regrowth is carried out so as to ensure a thickness of said layer of single crystal silicon suitable for said step of defining said plurality of microstructures.

Moreover, according to another aspect of the invention, said step of defining said plurality of microstructures comprises a patterning step of said layer of single crystal silicon and a subsequent step of exposure and photolithographic etching.

According to a further aspect of the invention, said step of defining said plurality of microstructures comprises a mechanical micromachining process.

Moreover, according to yet another aspect of the invention, said step of epitaxial regrowth of said layer of single crystal silicon comprises a chemical deposition process in vapour phase.

Also, according to another aspect of the invention, said step of epitaxial regrowth of said layer of single crystal silicon comprises a molecular beam epitaxy process.

According to an aspect of the invention, said definition step realises said plurality of microstructures shaped like an inverse pyramid.

In particular, according to this aspect of the invention, definition step realises said plurality of microstructures shaped like a rectilinear pyramid with a square base formed by the planes of the family 111 arranged symmetrically around a central axis having its centre coinciding with a centre of symmetry of a base of said rectilinear pyramid.

Moreover, according to an aspect of the invention, said definition step realises said plurality of microstructures of the type projecting from a plane of said substrate of single crystal silicon.

According to this aspect of the invention, said definition step realises said plurality of microstructures of the projecting type shaped like a diamond.

Namely, said definition step realises said plurality of microstructures of the projecting type shaped like a symmetrical diamond, formed by the planes of the family 111 and of the family 211 arranged around a central axis having its centre coinciding with a centre of symmetry of a base of said diamond.

Moreover, according to another aspect of the invention, said step of realising a functional coupling layer comprises a step of formation of a porous layer above said substrate of single crystal silicon, said porous layer having the function of a functional coupling layer.

According to this aspect of the invention, said step of formation of said porous layer comprises an electrochemical etching process that converts a surface portion of said substrate of single crystal silicon into a layer of porous silicon suitable for realising said porous layer.

In particular, according to this aspect of the invention, said step of formation of said porous layer comprises a step of formation of a layer of silicon with bubbles in an intermediate region of said substrate of single crystal silicon through a step of implantation of noble gases or Oxygen and subsequent heat treatment, said step of implantation and subsequent heat treatment converting said intermediate portion of substrate of single crystal silicon into said layer of silicon with bubbles suitable for realising said porous layer.

Moreover, according to an aspect of the invention, said step of formation of said porous layer realises a porous layer having a different porosity between a surface area thereof positioned at said layer of single crystal silicon and a bottom area thereof positioned in a position opposite said layer of single crystal silicon.

According to this aspect of the invention, said step of formation of said porous layer realises a porous layer having said surface area with a porosity equal to 40%-45% and a thickness of the order of a few nanometers and said bottom area with a greater porosity and thickness than said surface area.

Moreover, according to this aspect of the invention, said step of formation of said porous layer realises a porous layer having said bottom area with a porosity equal to 60% and a thickness equal to 10 microns.

Furthermore, according to another aspect of the invention, said step of realising a functional coupling layer further comprises a step of formation of a porous layer above said substrate of single crystal silicon as previously defined, said corrugated portion and said porous layer having the function of a functional coupling layer.

According to this aspect of the invention, said step of realising said corrugated portion of said semiconductive substrate is carried out before said step of formation of said porous layer, said porous layer and said layer of single crystal silicon both having a corrugated shape and forming said functional coupling layer of said semiconductive substrate.

According to an aspect of the invention, in said step of formation of said porous layer, a layer of silicon with bubbles is made in an intermediate region, near to the surface, of said substrate of single crystal silicon through a step of ionic implantation of nobles gases or oxygen and subsequent heat treatment, said step of implantation and subsequent heat treatment converting said intermediate portion of said substrate of single crystal silicon into said layer of silicon with bubbles suitable for realising said porous layer.

According to this aspect of the invention, said step of implantation and subsequent heat treatment further defines a first and a second portion of said substrate of single crystal silicon, separated from said layer of silicon with bubbles and wherein said step of realising said corrugated portion comprises a step of defining a plurality of microstructures in said first portion of said substrate of single crystal silicon.

Namely, said step of implantation and subsequent heat treatment realises said layer of silicon with bubbles with a high density of bubbles.

According to an aspect of the invention, said step of implantation is carried out at a surface portion of said substrate of single crystal silicon.

According to another aspect of the invention, said step of implantation is carried out at a bottom portion of said substrate of single crystal silicon.

Moreover, according to another aspect of the invention, the manufacturing process further comprises an epitaxial growth step of a surface layer directly above said functional coupling layer.

According to this aspect of the invention, said epitaxial growth step of said surface layer comprises an epitaxial growth step of a semiconductive material alternative to silicon.

In particular, said epitaxial growth step of said surface layer comprises an epitaxial growth step of a material chosen from silicon carbide, gallium nitride, gallium arsenide, zinc selinide and germanium selinide.

According to an aspect of the invention, said epitaxial growth step of said surface layer takes place after a further epitaxial growth step of a further silicon buffer layer made between said porous layer and said surface layer.

Moreover, according to another aspect of the invention, said epitaxial growth step of said surface layer is carried out at least for a suitable thickness such as to allow the integration of electronic and/or optoelectronic devices into said semiconductive substrate.

Namely, said epitaxial growth step of said surface layer is continued for a thickness greater than said suitable thickness to realise a self-supporting semiconductive substrate of large size and in that it further comprises a step of partial removal of said substrate of single crystal silicon of a different type with respect to said surface layer.

In particular, according to this aspect of the invention, said partial removal step takes place by abrasion.

According to another aspect of the invention, said partial removal step takes place by etching.

Finally, according to yet another aspect of the invention, the manufacturing process further comprises a high temperature growth step of a high quality bulk substrate of large size, suitable for subsequently realising electronic and/or optoelectronic devices.

The characteristics and advantages of the semiconductive substrate and of the corresponding manufacturing process according to the invention shall become clear from the following description of an embodiment thereof, given for indicating and not limiting purposes with reference to the attached drawings.

BRIEF DESCRIPTION OF THE DRAWINGS

In such drawings:

FIGS. 4A and 4B schematically show the mechanism for reducing the defects during a heteroepitaxy process using the substrate of FIGS. 1 and 2;

FIG. 5 shows a third embodiment of the semiconductive substrate according to the invention;

DETAILED DESCRIPTION

Figure 1:
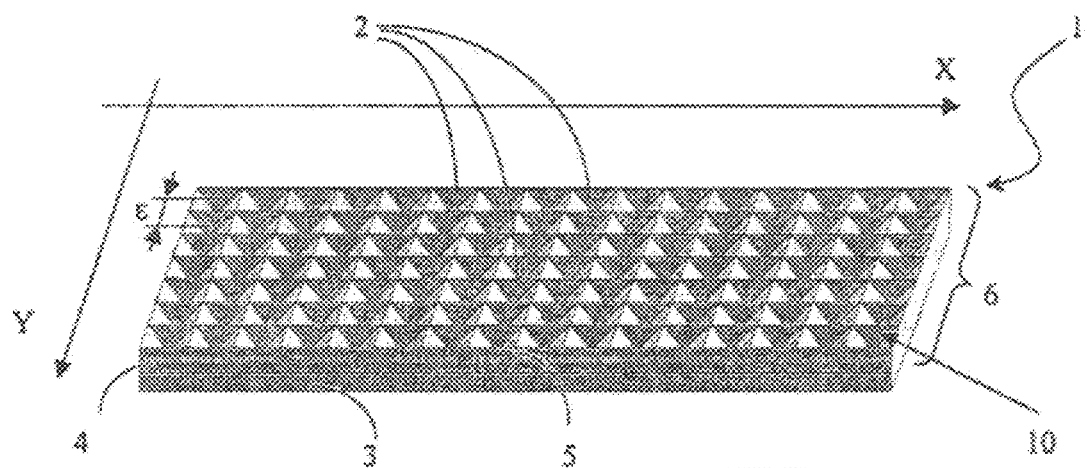
FIG. 1 schematically shows a first embodiment of a semiconductive substrate according to the invention.
Figures 2A, 2B:
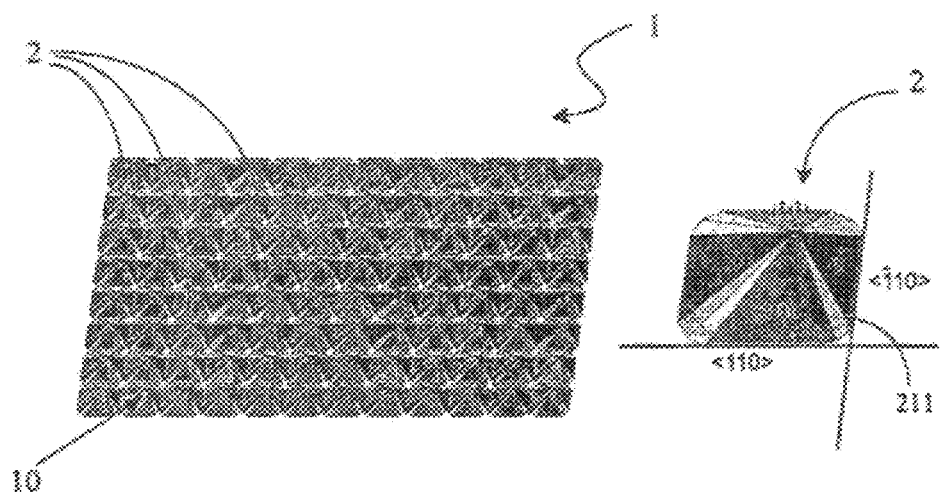
FIG. 2A schematically shows a second embodiment of the semiconductive substrate according to the invention.
FIG. 2B shows an enlarged view of a detail of the semiconductive substrate of FIG. 2A.

With reference to such figures, and in particular to FIGS. 1 and 2A, a semiconductive substrate made according to the invention is illustrated hereafter, wholly indicated with 1.

In particular, the semiconductive substrate 1 comprises at least one substrate 3, in particular of single crystal silicon, and an overlying layer of single crystal silicon 5 and it comprises at least one functional coupling layer 10 suitable for reducing the defects linked to the differences in the materials used.

In a first embodiment of the semiconductive substrate according to the invention, such a functional coupling layer 10 is made through at least one corrugated portion 6 made in such a layer 5 of single crystal silicon, substantially suitable for reducing the defects linked to the differences in lattice constant of the materials used. The functional coupling layer 10 is thus a layer capable of creating a bridge or join between the different layers within the semiconductive substrate 1 according to the invention, in particular also comprising semiconductor materials alternative to silicon.

It should be noted that such a layer 5 of single crystal silicon in its most general form is a surface portion of the substrate 3 of single crystal silicon.

The corrugated portion 6 comprises a plurality of microstructures 2, nanometrically defined in a surface portion thereof.

In a preferred embodiment of the semiconductive substrate 1 according to the invention, such microstructures 2 are equidistant according to at least one direction between a first and a second direction of extension of the semiconductive substrate 1, indicated in FIG. 1 as X and Y. In other words, the substrate is corrugated according to both of such main directions of extension X and Y, in a symmetrical manner.

It should be noted that it is not only the presence but also the particular configuration of the microstructures 2 that allows the planar defects due to the differences in lattice constant of the materials used, in particular semiconductor materials alternative to silicon, to be reduced.

In particular, FIG. 1 shows a first embodiment of the semiconductive substrate 1 comprising a plurality of microstructures 2 having the form of an inverse pyramid-shaped recess. More specifically, each microstructure 2 has a structure shaped like a rectilinear pyramid with a square base formed from the planes of the family 111 arranged symmetrically around a central axis having its centre coinciding with the centre of symmetry of a base of such a pyramid-shaped structure, where by family of planes a group of planes with the same superficial atomic configurations is intended.

FIG. 2A, on the other hand, shows a second embodiment of the semiconductive substrate 1 comprising a plurality of microstructures 2, projecting from a plane defined by the substrate 3 of single crystal silicon, in particular shaped like a pyramid. In particular, each pyramid, shown in greater detail in FIG. 2B, has a symmetrical diamond-shaped structure, formed by the planes of the family 111 (indicated as main planes with reference to a base plane 110) and of the family 211 (indicated as secondary planes) arranged around a central axis having its centre coinciding with the centre of symmetry of a base of such a diamond-shaped structure. It is worth emphasising the fact that, observed along one of the two main directions X or Y, the pyramids of FIG. 2A have the same geometry as the recesses of FIG. 1.

Such a semiconductive substrate 1, thanks to the presence of the corrugated portion 6 that realises the functional coupling layer 10, thus allows the defects linked to the differences in lattice constant of the materials used to be reduced or even eliminated, in this way allowing semiconductor materials alternative to silicon to be used.

Advantageously according to the invention, the corrugated portion 6 has a symmetrical progression in the two main directions X and Y of extension of the semiconductive substrate 1, in this way ensuring isotropic behaviour of the substrate itself.

It is also possible to realise the functional coupling layer 10 through a porous layer 4 substantially suitable for reducing the stress caused by the differences between the thermal expansion coefficients of the materials used. In this case, the layer 5 of single crystal silicon is made above such a porous layer 4.

In particular, the porous layer 4 is suitable for reducing the stress caused by the differences in heat expansion coefficient of the materials realising up the semiconductive substrate 1 and is essentially in the form of a layer of porous silicon (also indicated as PS) made above a silicon substrate. Alternatively, it is possible to realise the porous layer 4 through a layer with bubbles obtained thanks to the use of ionic implantation of noble gases or of oxygen.

The functional coupling layer 10 made through the porous layer 4 is thus a buffer layer capable of overcoming the problems linked to the different heat expansion coefficients of the materials used. In other words, such a functional coupling layer 10 realises an interface between the layers made from different materials.

Figure 3A:
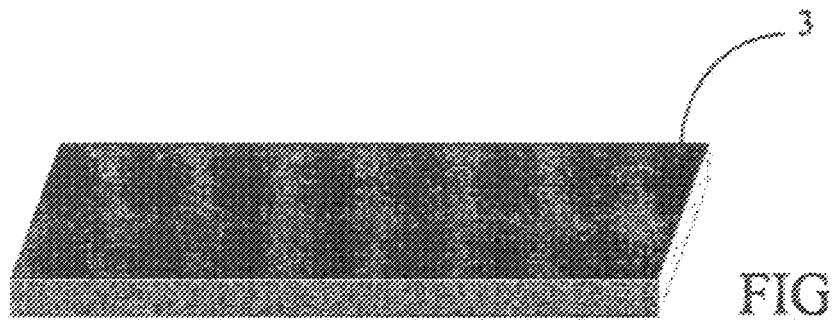
FIGS. 3A-3D show the semiconductive substrate of FIG. 1 in different steps of the manufacturing process according to the invention.
Figure 3B:
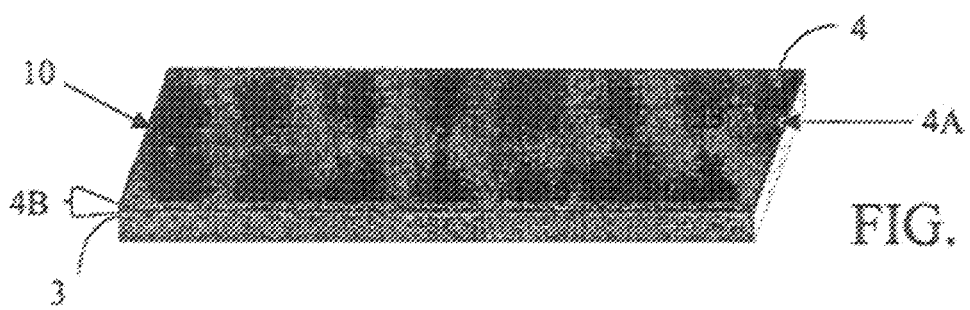

In an alternative embodiment of the semiconductive substrate 1, the layer 4 of porous silicon (PS) has a different porosity between a surface area thereof, corresponding to a top surface 4A (where the layer 5 of single crystal silicon is made) and a bottom area 4B thereof (positioned in a position opposite such a layer 5), as illustrated in FIG. 3B.

In particular, the layer 4 of porous silicon (PS) comprising a surface area 4A having a porosity equal to 40%-45% with low thickness, of the order of a few nanometers, and a bottom area 4B having greater porosity and thickness, in particular respectively equal to 60% and to 10 microns.

Such a semiconductive substrate 1, thanks to the presence of the porous layer 4 that realises the functional coupling layer 10, thus allows the stress caused by the differences in heat expansion coefficient of the materials realising up the semiconductive substrate 1 to be reduced or even eliminated, in this way allowing semiconductor materials alternative to silicon to be used.

Advantageously, in accordance with the present invention, the semiconductive substrate 1 also comprises a surface layer 7, as illustrated in FIGS. 4A and 4B, in particular of silicon carbide made through heteroepitaxial growth above the layer 5 of single crystal silicon with the corrugated portion 6 so as to produce wafers and a seed of silicon carbide (SiC) capable of allowing the growth of a block of a size such as to exceed the current limitations of growth technology on silicon carbide (SiC), currently equal to diameters of from 75 to 100 mm.

It is also possible to realise the semiconductive substrate 1 according to the invention by using a surface layer 7 of gallium nitride (GaN) grown on the layer 5 of single crystal silicon, in particular made with an epitaxial diamond growth.

In a preferred embodiment of the invention, the microstructures 2 within the corrugated portion 6 are suitably made in the layer 5 of single crystal silicon made above the porous layer 4.

In this case, as shall be made even clearer in the rest of the description, the combination of the porous layer 4 and of the special surface configuration of the structure of the semiconductive substrate 1, in particular the presence in the layer 5 of single crystal silicon of the corrugated portion 6, allows a surface layer 7 to be obtained through an epitaxial growth step free from the problems that known solutions suffer from.

Basically, the semiconductive substrate 1, according to this preferred embodiment of the invention, is suitable for combining the benefits of a corrugated substrate with those of a compliant substrate, in this way being a corrugated and compliant substrate.

Let us now see the manufacturing process according to the invention in greater detail, with reference in particular to FIGS. 3A-3D.

It should be noted that the process steps described hereafter do not form a complete process flow for the manufacture of integrated circuits. The present invention can be put into practice together with the manufacturing techniques currently used in the field, and only those steps of the process commonly used that are necessary for understanding the present invention are included.

Moreover, the figures that represent schematic views of portions of the semiconductive substrate 1 during the manufacturing are not drawn to scale, but instead are drawn so as to emphasise the important features of the invention.

Advantageously, according to the invention, the semiconductive substrate 1 comprises a functional coupling layer 10 in the form of a corrugated portion 6 having a plurality of microstructures 2 nanometrically defined, in particular a layer of single crystal silicon, such microstructures essentially comprising a plurality of recesses or pyramids suitable for reducing the defects caused by the differences in lattice constant of the materials used, in particular semiconductor materials alternative to silicon.

More specifically, such microstructures 2 are used to close the atomic dislocations introduced by the differences in lattice constant during an epitaxial growth step, in particular according to an axis (111) of the crystalline lattice of silicon.

Such closing takes place once a critical thickness Thcrit has been exceeded, such critical thickness being given by 2×h where h is the depth of the microstructures 2, said depth depending upon the geometric size thereof.

In this way, it is possible to close the atomic dislocations and begin a subsequent epitaxial growth step of a surface layer 7 so as to be free from the atomic dislocations described above. Advantageously according to the invention, such an epitaxial surface layer 7 can therefore be made from a semiconductive material alternative to silicon, without incurring the problems described in relation to the prior art.

In an alternative embodiment, the process according to the invention realises the functional coupling layer 10 through a layer of porous silicon (PS) used as porous layer 4 to reduce the stress generated by the differences in expansion coefficient of the materials used, in particular semiconductor materials alternative to silicon, in this way realising a corrugated and compliant substrate.

Porous silicon (PS) is a material that has been widely researched, particularly in recent years, in the search for new materials for realising semiconductor devices.

In particular, it has been for example demonstrated that it is possible to reduce the stress of a layer of zinc-selenium (ZnSe) grown with chemical deposition in vapour phase on a layer of porous silicon (PS) just as there is a reduction in stress in the case of layers of gallium arsenide (GaAs) and of silicon-germanium (GeSi) grown epitaxially on a silicon/porous silicon/silicon (Si/PS/Si) substrate through metalorganic chemical deposition in vapour phase.

Regarding this, see the articles by C. C. Chang et al. having the title: "Characterization and fabrication of ZnSe epilayer on porous silicon substrate" Thin Solid Films 379 (2000) 287-291, by S. Saravanan et al. having the title: "Growth and characterization of GaAs epitaxial layer on Si/porous Si/Si substrate by chemical beam epitaxy" J. Appl. Phys. Vol. 89 (2001) pp. 5215-5219 No 9, by Yasuhiko Hayashi et al. having the title: "Thermal Stress Relaxation in GaAs layer on New thin Si layer over Porous Si Substrate Grown by metalorganic chemical vapor deposition" Jpn. J. Appl. Phys. Vol. 37 (1998) pp.L 1354-L1357 and by S. I. Romanov et al. having the title: "GeSi Films With Reduced Dislocation Density Grown by Molecular-Beam Epitaxy on Compliant Substrate Based on Porous Silicon", Applied Physics Letters.

Moreover, it has been found that a further layer of silicon, for example with the function of a buffer layer, grown above a layer of porous silicon (PS) allows the stress caused by the differences in lattice constant between gallium arsenide (GaAs) and silicon as well as between silicon-germanium (GeSi) and silicon to be reduced.

In its most general form, the process for forming a semiconductive substrate 1 according to the invention thus comprises the following steps in sequence:
a) formation of a substrate 3, in particular of single crystal silicon, in the form of a flat plate;
b) epitaxial regrowth of a layer 5 of single crystal silicon above the substrate 3 of single crystal silicon, in particular through a chemical vapour deposition (CVD) process; alternatively, it is possible to use a molecular beam epitaxy (MBE) process; and
c) realising a functional coupling layer 10 above such a substrate 3 of single crystal silicon.

In the present invention, the semiconductive substrate has minimum feature size dimensions in the order of about 100 μm. The expression "minimum feature size" refers here to the smallest detail that can be produced on the chip.

Figures 9A, 9B:
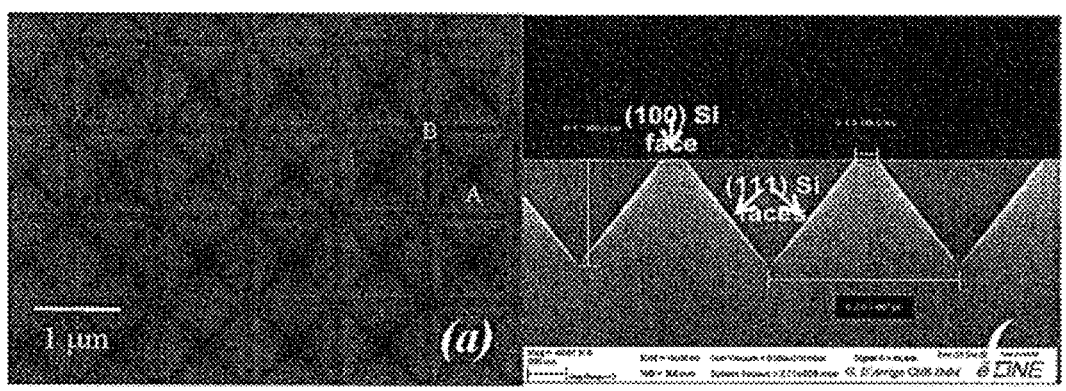
FIG. 9a is a top view electron microscope photograph (TEM) of the semiconductive substrate of the present invention.
FIG. 9b is a cross section electron microscope photograph (TEM) of the semiconductive substrate of the present invention.

With reference to the microcrystalline structures, the bases (and the faces) of the inverse pyramids have dimensions in the order of 0.1 to 10 μm in length, preferably around 1 μm (see FIG. 9a).

The distance between adjacent inverse pyramids is of the order of 0 to 50%, preferably 0 to 20%, more preferably 0 to 10% of the length of the base of the inverse pyramid (see FIG. 9b). Preferably, adjacent pyramids of the present invention are practically consecutive, without interruption. This distance is functional to the formation of a low defect density epitaxial layer, as will be better discussed below in relation to FIG. 12).

Figure 10:
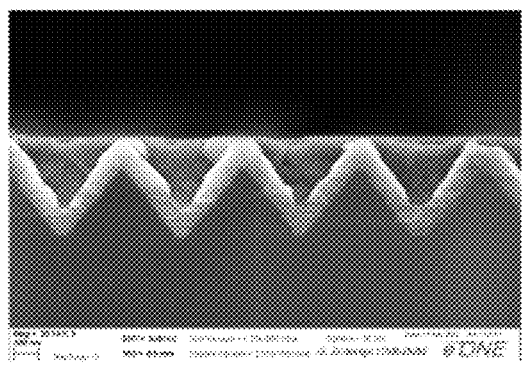
FIG. 10 is a cross section electron microscope photograph (TEM) of the semiconductive substrate of the present invention whereupon a layer of 3C—SiC has been deposited.

Moreover, during the epitaxial growth process, the distance between adjacent inverse pyramids is further reduced in the present invention and tends to zero (see FIG. 10, where the substrate is covered by a layer of 3C—SiC).

Preferably, for the formation of a low defect density layer the angle of the tip of the inverse pyramid is comprised between 30 and 60°. In particular, in FIG. 9b there is shown a crystallographic direction of (111). As will be better explained with reference to FIG. 12, the tip of the pyramids is also important in the optimization of the epitaxially grown layer in terms of defects. The presence of a tip and, in particular, its angle, are functional in modulating the distribution of the high- and low-defect density zones.

Figure 11:
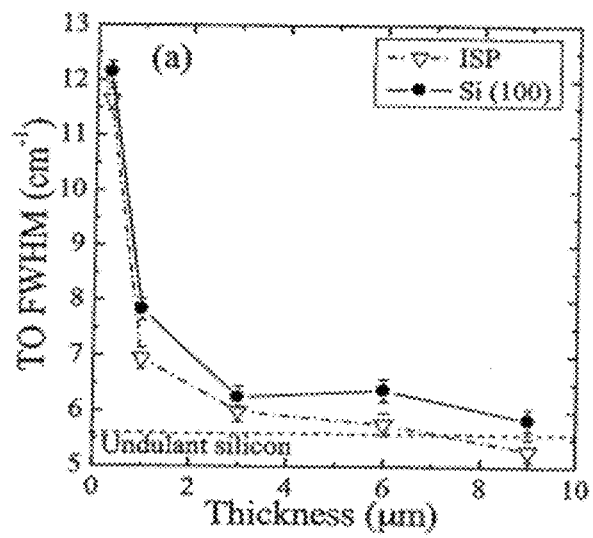
FIG. 11 is a graph comparing a 3C—SiC (the epitaxially grown layer) grown on the substrate of the present invention (marked ISP); that grown on Si(100); and that grown on a substrate of the prior art (according to patent application U.S. 2003/0045102 to Nagasawa et al.) having an undulated surface.

Turning now to the graph of FIG. 11, this pertains to the discussion of the reduction of the defects and shows a comparison between the 3C—SiC (the epitaxially grown layer) grown on the substrate of the present invention (marked ISP); that grown on Si(100) (that is, a silica planar wafer); and that grown on a substrate of the prior art (according to patent application U.S. 2003/0045102 to Nagasawa et al.) having an undulated surface.

The graph shows the pattern of the width of the Raman peak (which is inversely proportional to the density of the defects) as a function of the thickness of the layer formed. The graph shows that, for both the inverse shaped pyramid (ISP) substrate and the Si(100) substrate, the density of the defects decreases with increasing thickness, but in the case of the ISP substrate the decrease is more marked except with very thin thicknesses where there is not a complete closing of the pyramids (as better illustrated below with reference to FIG. 12). Moreover, with the substrate of the present invention, a defect density lower than that reported by Nagasawa et al. is observed, the latter reporting thicknesses of up to about 200 μm.

It can thus be predicted that further increasing the thickness can bring about a further decrease in the defect density observed, and that would contribute to form on this material devices of improved power compared to what can be done to date on silica, and at reasonable costs.

Figure 12:
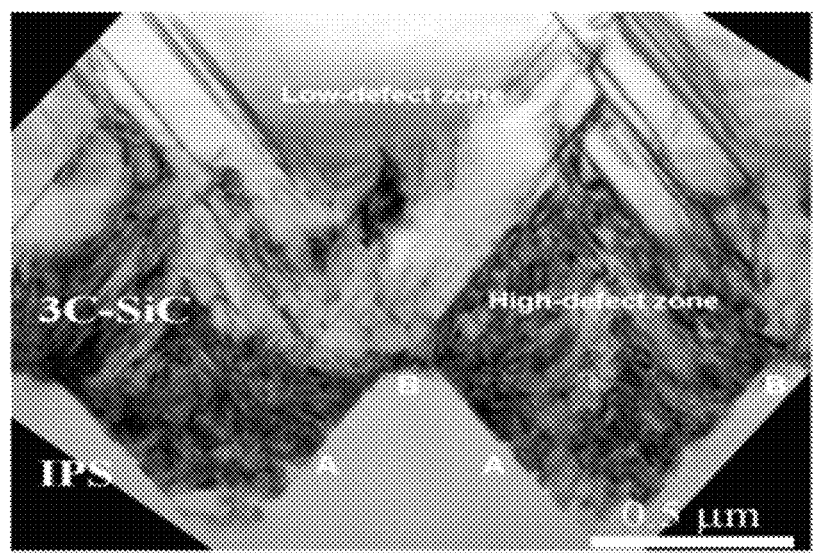
FIG. 12 is a cross section electron microscope photograph (TEM) of the semiconductive substrate of the present invention whereupon a layer has been epitaxially grown and which illustrates the location of the low defect and high defect zones.

With reference to FIG. 12, this is a cross-section of the transmission electron microscope (TEM) of the ISP substrate which illustrates the mechanism by which the present invention reduces the defect density (also referred to as "stacking faults"). It can be seen that the areas within the pyramids show a high density of defects (darker colour) and that after a certain thickness of growth, of about twice the height of the pyramids, the defects are fewer giving rise to a low defect film. By varying the dimensions of the pyramids, and the angle of the tips, it is possible to optimize the substrate to entrap all the defects within the pyramid areas (the layer becoming progressively more defect-free with increasing thickness).

In particular, the step of realising the functional coupling layer 10 comprises a step of realising a corrugated portion 6 of the semiconductive substrate 1 through definition of a plurality of microstructures 2 in the layer 5 of single crystal silicon.

In this way, the process according to the invention realises a semiconductive substrate 1 with the corrugated portion 6 acting as functional coupling layer 10 or corrugated substrate, reducing or eliminating the defects linked to the differences in lattice constant of the materials used.

Alternatively, the step of realising the functional coupling layer 10 comprises a step of formation of a porous layer 4 above such a substrate 3 of single crystal silicon.

In this case, the formation process comprises the following steps in sequence:
a) formation of a substrate 3 of single crystal silicon, in the form of a flat plate;
b) formation of the porous layer 4 acting as functional coupling layer 10, in particular of porous silicon (PS) above such a substrate 3 of single crystal silicon through an electrochemical etching process; in particular, such an electrochemical etching process converts a surface portion of the substrate 3 of single crystal silicon into the layer 4 of porous silicon (PS); and
c) epitaxial regrowth of a layer 5 of single crystal silicon above the layer 4 of porous silicon (PS), in particular through a chemical vapour deposition (CVD) process; alternatively, it is possible to use a molecular beam epitaxy (MBE) process.

In this way, the process according to the invention realises a semiconductive substrate 1 with the porous layer 4 acting as functional coupling layer 10 or compliant substrate, reducing or eliminating the stress caused by the differences in heat expansion coefficient of the materials used.

Figure 3C:
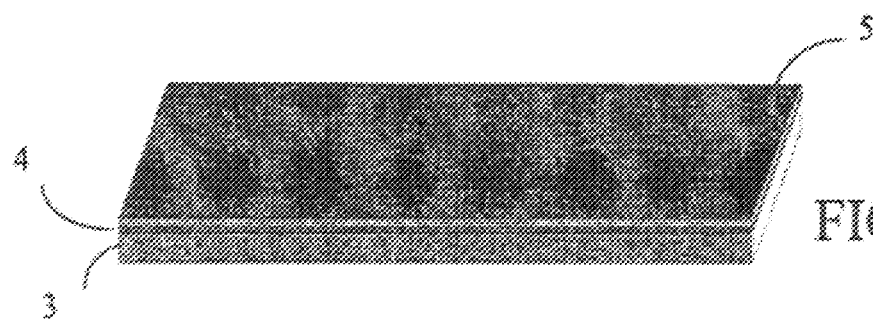
Figure 3D:
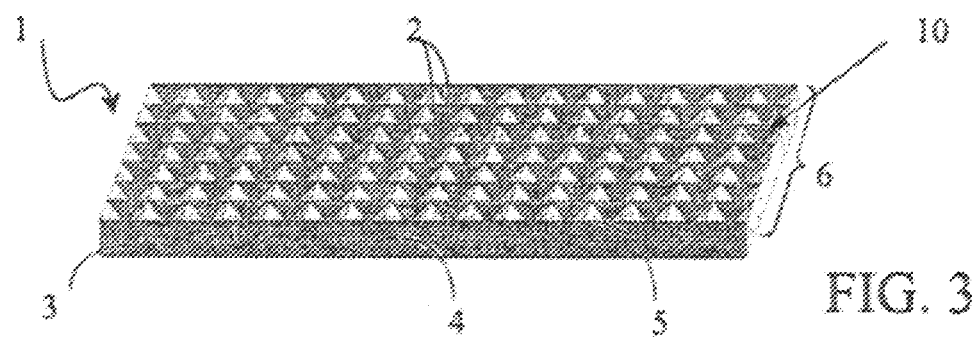
Figure 6A:
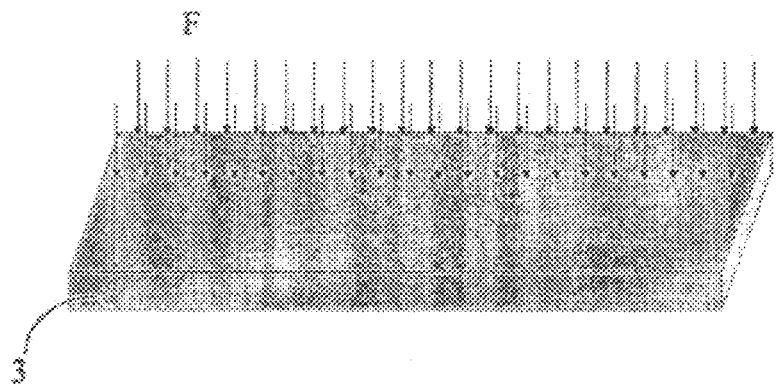
FIGS. 6A-6B show the semiconductive substrate according to the invention in different steps of the manufacturing process of the porous layer obtained through ionic implantation.
Figure 6B:
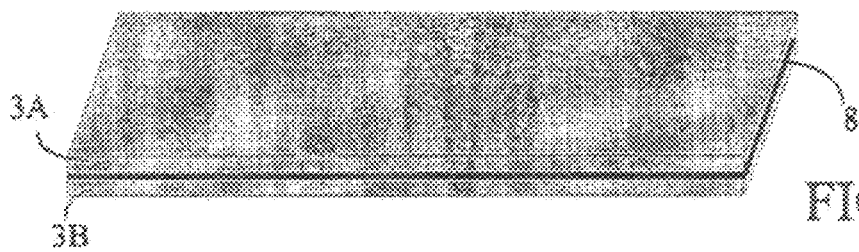
Figure 6C:
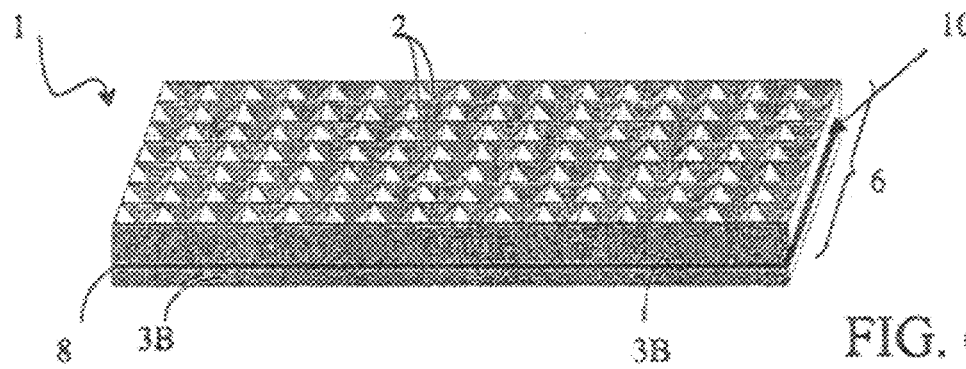
FIG. 6C shows the semiconductive substrate according to the invention comprising a porous layer obtained through ionic implantation and a subsequent corrugation of its surface.

In a preferred embodiment of the invention, the process for forming a semiconductive substrate 1 according to the invention thus comprises the following steps in sequence:

a) formation of a substrate 3 of single crystal silicon, in the form of a flat plate, as schematically illustrated in FIG. 3A;

b) formation of a porous layer 4, in particular of porous silicon (PS) above such a substrate 3 of single crystal silicon through an electrochemical etching process, as schematically illustrated in FIG. 3B; in particular, such an electrochemical etching process converts a surface portion of the substrate 3 of single crystal silicon into the layer 4 of porous silicon (PS);

c) epitaxial regrowth of a layer 5 of single crystal silicon above the layer 4 of porous silicon (PS), in particular through a chemical vapour deposition (CVD) process, as schematically illustrated in FIG. 3C; alternatively, it is possible to use a molecular beam epitaxy (MBE) process; and d) realising a corrugated portion 6 of the semiconductive substrate 1 through definition of a plurality of microstructures 2 on the substrate as made by the previous steps and in particular in the layer 5 of single crystal silicon, as schematically illustrated in FIG. 3D.

In this way, the process according to the invention realises a semiconductive substrate 1 with the functional coupling layer 10 made from the corrugated portion 6 and the porous layer 4 or corrugated and compliant substrate, reducing or eliminating all of the possible causes of defects that known substrates still suffer from.

It should be noted that the step of epitaxial regrowth of the layer 5 of single crystal silicon is carried out so as to ensure a thickness of such a layer 5 suitable for the subsequent step of defining the plurality of microstructures 2, in particular made through patterning of the layer 5 of single crystal silicon with subsequent step of exposure and photolithographic etching or else through a mechanical process such as micromachining.

Moreover, it is preferable to realise a layer 4 of porous silicon (PS) having a different porosity between a surface area thereof, corresponding to a top surface 4A where the layer 5 of single crystal silicon is made and a bottom area 4B thereof positioned in a position opposite such a layer 5, as illustrated in FIG. 3B.

Experiments conducted by the Applicant itself have shown how a layer 4 of porous silicon (PS) comprising a surface area 4A having a porosity equal to 40%-45% with low thickness, of the order of a few nanometers, and a bottom area 4B having a greater porosity and thickness, in particular respectively equal to 60% and to 10 microns, is optimal.

The process for forming the semiconductive substrate 1 at this point comprises an epitaxial growth step for a suitable thickness of a surface layer 7, in particular of a semiconductive material alternative to silicon, directly above the structure obtained with the sequence of steps described above, or else with interposition of a buffer layer (not illustrated since it is conventional).

It is worth noting the fact that such a surface layer 7 is free from defects even if made from a semiconductive material alternative to silicon, thanks to the particular structure of the semiconductive substrate 1 that comprises the porous layer 4 and the corrugated portion 6 and that allows the problems linked to the differences in lattice constant and in expansion coefficients of the materials involved to be overcome.

In a first embodiment of the semiconductive substrate 1 according to the invention, the layer 5 of single crystal silicon comprises a plurality of microstructures 2 each shaped like an inverted pyramid with a square base, as illustrated in FIG. 3D.

It can immediately be seen how such microstructures 2 are able to reduce the defects linked to the atomic dislocations in all directions. Indeed, such defects increase perpendicularly to the side faces of the pyramids forming the microstructures 2, arranged according to the directions (111) and therefore, through the epitaxial growth of the surface layer 7 having a thickness equal to at least double the height of the pyramids forming the microstructures 2, as schematically illustrated in FIGS. 4A and 4B, it is possible to close the atomic dislocations and obtain a semiconductive substrate 1 having a surface layer 7 without defects linked to the atomic dislocations of the different materials used and therefore suitable for realising a layer of a semiconductive material alternative to silicon.

It should be noted that such a surface layer 7 can have a thickness of a few microns and that the semiconductive substrate 1 thus obtained can be used to realise electronic or optoelectronic devices.

It is also possible to use a surface layer 7 obtained through a longer-lasting epitaxial growth, in this way realising a self-supporting semiconductive substrate of large size, which can thereafter be partially removed by lapping or etching of all of the substrate of a different type with respect to the surface layer 7.

Furthermore, it is possible to introduce the semiconductive substrate 1 thus obtained into a CVD reactor for the high-temperature growth of a high-quality substrate bulk of large size, suitable for subsequently realising electronic or optoelectronic devices.

The semiconductive substrate 1 can also be obtained through an alternative embodiment of the formation process according to the invention, comprising the following steps in sequence:

a) formation of a substrate 3, in particular of single crystal silicon, in the form of a flat plate;

b) definition on such a substrate 3 of a plurality of microstructures, through a photolithographic and mechanical process, as illustrated previously;

c) formation of a layer 4 of porous silicon (PS) above such a substrate 3 through an electrochemical etching process, as illustrated previously;

d) epitaxial regrowth of a layer 5 of single crystal silicon above the layer 4 of porous silicon (PS) for a predetermined thickness; and e) epitaxial growth of a surface layer 7 directly above the structure obtained with the sequence of steps described above, or else with interposition of a buffer layer (not illustrated since it is conventional).

The semiconductive substrate 1 obtained with such a sequence of steps is schematically illustrated in FIG. 5. In particular, it should be noted how the layer 4 of porous silicon (PS) and the layer 5 of single crystal silicon both have a corrugated shape and form the functional coupling layer 10 of the semiconductive substrate 1.

Also in this case, the semiconductive substrate 1 obtained has a reduction in stress due to the differences in heat expansion coefficient, thanks to the use of the layer 4 of porous silicon (PS) and to the closing of the atomic dislocations obtained from the surface layer 7 made above the corrugated portion 6.

Also in this case, the epitaxial growth of the surface layer 7 can be carried out so as to obtain a layer with a thickness of a few microns and a semiconductive substrate 1 thus able to be used to realise electronic or optoelectronic devices.

It is also possible to realise a surface layer 7 through a longer-lasting epitaxial growth, in this way obtaining a self-supporting semiconductive substrate of large size, which can thereafter be partially removed by lapping or etching.

Furthermore, it is possible to introduce the semiconductive substrate 1 thus obtained into a CVD reactor for the high-temperature growth of a high-quality substrate bulk of large size, suitable for subsequently realising electronic or optoelectronic devices.

Figure 7A:
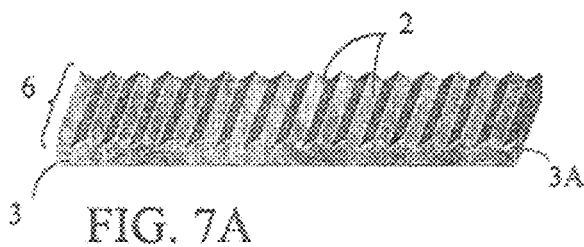
FIGS. 7A-7D and 8A-8C show the semiconductive substrate of FIG. 5 in different steps of the manufacturing process according to the invention.
Figure 7B:
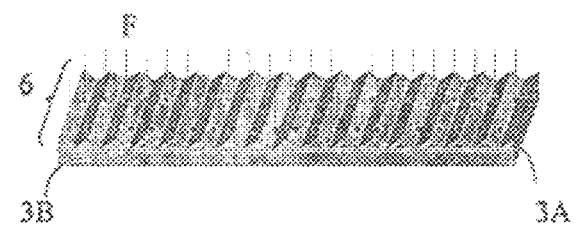
Figure 7D:
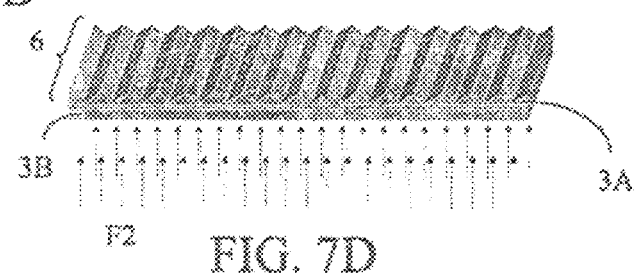
Figure 7C:
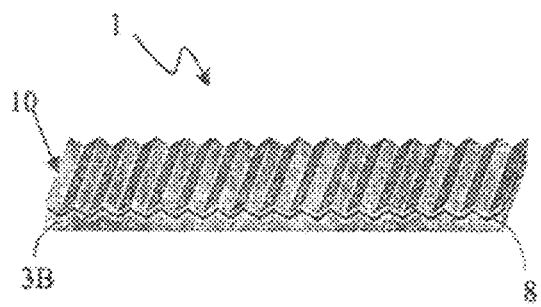

According to a further alternative embodiment of the formation process according to the invention the semiconductive substrate 1 is obtained through the following steps in sequence:
a) formation of a substrate 3 of single crystal silicon, in the form of a flat plate, as schematically illustrated in FIG. 7A;
b) definition of a plurality of microstructures, in particular a plurality of microstructures 2 on a portion 3A of such a substrate 3 in this way obtaining a semiconductive substrate 1 with a corrugated portion 6 comprising the plurality of microstructures 2, as schematically illustrated in FIG. 7A; and
c) formation of a layer 8 of silicon with bubbles, which can be considered as similar to a porous layer, in an intermediate region, preferably near to the surface a few tens of nanometers away, of such a substrate 3 through an implantation of a noble gas or of oxygen, as illustrated in FIG. 7B, schematically indicated with F, and subsequent heat treatment, as illustrated in FIG. 7C; in particular, such a step of implantation and subsequent heat treatment converts an intermediate portion of the substrate 3 of single crystal silicon into the layer 8 of silicon with bubbles, as schematically illustrated in FIG. 7C, also defining a first 3A and a second portion 3B of the substrate 3, separated from such a layer 8 of silicon with bubbles, such a first portion 3A having the plurality of microstructures 2 and defining the corrugated portion 6 of the semiconductive substrate 1.

In particular, the semiconductive substrate 1 thus obtained comprises the layer 8 of silicon with bubbles and the corrugated portion 6 that form the functional coupling layer 10.

As seen previously, preferably, the layer 8 of silicon is suitably made with a high density of bubbles, so as to achieve the required reduction in stress linked o the differences in heat expansion of the materials used, the first corrugated portion 3A of the substrate 3 of single crystal silicon being used to reduce the defects linked to the differences in lattice constant.

The semiconductive substrate 1 in this case is also added to by a surface layer 7 grown above the structure obtained with the process steps described previously, such a surface layer 7 being essentially without defects at the temperature necessary for its growth step, even in the presence of large differences in lattice constant of the materials used and thus advantageously being able to be a layer of a semiconductive material alternative to silicon.

It should be highlighted that it is possible to carry out the implantation to form the layer 8 of silicon with bubbles at a surface portion of the substrate 3 of single crystal silicon (as indicated by the arrow F in FIG. 7A) or else in the opposite direction (by carrying out the implant from the back), at a bottom portion of the substrate 3 of single crystal silicon (as indicated by the arrow F2 in FIG. 7D).

As seen previously, the epitaxial growth of the surface layer 7 can be carried out so as to obtain a layer with a thickness of a few microns and a semiconductive substrate 1 thus able to be used to realise electronic or optoelectronic devices.

It is also possible to realise a surface layer 7 through a longer-lasting epitaxial growth, in this way obtaining a self-supporting semiconductive substrate of large size, which can thereafter be partially removed by lapping or etching.

Furthermore, it is possible to introduce the semiconductive substrate 1 thus obtained into a CVD reactor for the high-temperature growth of a high-quality substrate bulk of large size, suitable for subsequently realising electronic or optoelectronic devices.

Figure 8A:
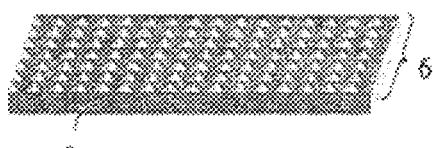
Figure 8B:
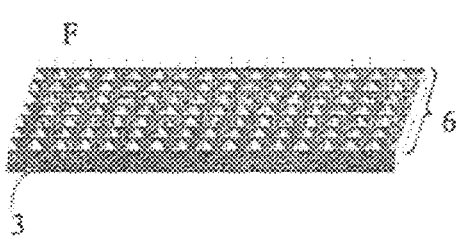
Figure 8C:
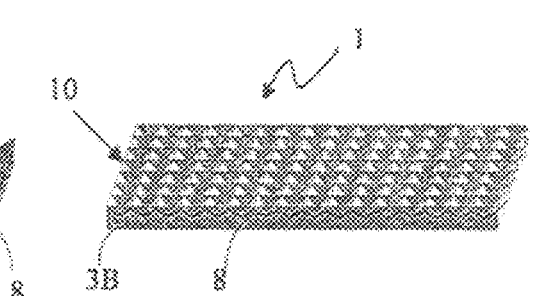

In the process steps illustrated in FIGS. 7A-7D, microstructures 2 having continuous progression along a direction of extension, in particular the second direction Y, of the semiconductive substrate 1, have been indicated, as an example and in no way limiting to the invention. It is also possible to consider pyramid-shaped microstructures 2, as in the previous embodiments, the process comprising the identical sequence of steps indicated above, as illustrated in FIGS. 8A-8C.

Basically, the semiconductive substrate obtained according to the invention combines the benefits of corrugated substrates with those of compliant substrates and allows semiconductor materials alternative to silicon to be used, with the consequent advantages in terms of production costs, without however encountering the problems highlighted in relation to the prior art, the defects linked to the differences in lattice constant and in heat expansion coefficient of the materials used being eliminated thanks to the use of the porous layer 4 and of the plurality of microstructures 2.

In particular, such a semiconductive substrate 1 can be used for heteroepitaxy of materials with large differences in the lattice constant (10-20%). In a preferred embodiment of the invention, the formation process of the semiconductive substrate 1 is used to realise an epitaxy of silicon carbide (SiC) 3C on silicon, diamond on silicon (difference 50%) and gallium nitride (GaN) on silicon or on Al2O3.

Advantageously according to the invention, the semiconductive substrate 1 allows a wafer and a seed of a semiconductive material alternative to silicon, for example of silicon carbide (SiC) to be produced, which is able to allow the growth of a block of a size such as to overcome the drawbacks of current technology of growth on semiconductor materials alternative to silicon, in particular, in the case of silicon carbide (SiC), limited to diameters of from 75 to 100 mm.

In conclusion, advantageously according to the invention, a semiconductive substrate is obtained that allows the growth of high-quality heteroepitaxial layers on a structure of single crystal silicon with a functional coupling layer 10 comprising a corrugated portion and/or a porous layer capable of eliminating the defects linked to the differences in lattice constant and/or in heat expansion coefficient of the materials used and allowing the use of semiconductor materials alternative to silicon.

Of course, a man skilled in the art can bring numerous modifications and variants to the semiconductive substrate and to the process described above, in order to satisfy contingent and specific requirements, all of which are covered by the scope of protection of the invention as defined by the following claims.

The invention claimed is:

1. A semiconductive substrate hetero-growing a semiconductive material that has a different lattice constant from that of single crystal silicon for realising electronic and/or optoelectronic devices comprising said semiconductive substrate, said semiconductive substrate in turn comprising:
    a single crystal silicon substrate,
    an overlying layer of single crystal silicon,
    at least one functional coupling layer, comprising a corrugated portion made in said layer of single crystal silicon, reducing the defects linked to the differences in the materials used, alternative to silicon, by closing the atomic dislocations, said corrugated portion comprising a plurality of microstructures shaped like inverse pyramids having a tip, the inverse pyramids being formed closely adjacent to one another, and a surface layer made through heteroepitaxial growth above said layer of single crystal silicon.

2. The semiconductive substrate according to claim 1, wherein said microstructures are shaped like a rectilinear pyramid with a square base formed by the planes of the family 111 arranged symmetrically around a central axis having its centre coinciding with a centre of symmetry of a base of said rectilinear pyramid.

3. The semiconductive substrate according to claim 1, wherein said functional coupling layer comprises a porous layer suitable for reducing the stress caused by the differences between the thermal expansion coefficients of the materials used.

4. The semiconductive substrate according to claim 1, wherein it also comprises a surface layer made above said porous layer.

5. The semiconductive substrate according to claim 4, wherein it further comprises a silicon buffer layer made between said functional coupling layer and said surface layer.

6. The semiconductive substrate according to claim 1, having the smallest detail that can be produced on the chip of dimensions in the order of about 100 μm.

7. The semiconductive substrate according to claim 1, wherein the bases and the faces of said inverse pyramids have dimensions of the order of 0.1 to 10 μm in length.

8. The semiconductive substrate according to claim 7, wherein the bases and faces of said inverse pyramids have dimensions of around 1 μm.

9. The semiconductive substrate according to claim 1, wherein the distance between said adjacent inverse pyramids is of the order of 0 to 50% of the length of the base of the inverse pyramid.

10. The semiconductive substrate according to claim 9, wherein the distance between said adjacent inverse pyramids is of the order of 0 to 20% of the length of the base of the inverse pyramid.

11. The semiconductive substrate according to claim 10, wherein the distance between said adjacent inverse pyramids is of the order of 0 to 10% of the length of the base of the inverse pyramid.

12. The semiconductive substrate according to claim 1, wherein said adjacent pyramids are consecutive, without interruption.

13. The semiconductive substrate according to claim 1, wherein the angle of the downward pointing tip of the inverse pyramid is comprised between 30 and 60°.

14. The semiconductive substrate according to claim 1, wherein the heterolayer is of a material chosen from the group consisting of silicon carbide, gallium nitride, gallium arsenide, zinc selenide and germanium selenide.

* * * * *